(12) United States Patent
Visconti et al.

(10) Patent No.: US 12,112,785 B2
(45) Date of Patent: Oct. 8, 2024

(54) APPARATUSES, SYSTEMS, AND METHODS FOR CONFIGURABLE MEMORY

(71) Applicant: MICRON TECHNOLOGY, INC., Boise, ID (US)

(72) Inventors: Angelo Visconti, Appiano Gentile (IT); Giorgio Servalli, Fara Gera d'Adda (IT)

(73) Assignee: Micron Technology, Inc., Boise, ID (US)

( * ) Notice: Subject to any disclaimer, the term of this patent is extended or adjusted under 35 U.S.C. 154(b) by 210 days.

(21) Appl. No.: 17/732,885

(22) Filed: Apr. 29, 2022

(65) Prior Publication Data
US 2023/0352073 A1    Nov. 2, 2023

(51) Int. Cl.
*G11C 11/22* (2006.01)

(52) U.S. Cl.
CPC ........ *G11C 11/2255* (2013.01); *G11C 11/221* (2013.01); *G11C 11/2273* (2013.01)

(58) Field of Classification Search
CPC .............. G11C 11/2255; G11C 11/221; G11C 11/2273
See application file for complete search history.

(56) References Cited

U.S. PATENT DOCUMENTS

| | | |
|---|---|---|
| 5,338,951 A | 8/1994 | Argos et al. |
| 8,331,128 B1 * | 12/2012 | Derhacobian ........ G11C 29/816 365/189.08 |
| 9,761,312 B1 | 9/2017 | Kajigaya |
| 11,074,964 B1 | 7/2021 | Kawamura et al. |
| 11,127,744 B2 | 9/2021 | Servalli et al. |
| 11,211,113 B1 | 12/2021 | Derner et al. |
| 11,545,205 B2 | 1/2023 | Vimercati |
| 11,763,870 B2 | 9/2023 | Vimercati |
| 2003/0053346 A1 | 3/2003 | Bruchhaus et al. |

(Continued)

FOREIGN PATENT DOCUMENTS

| | | |
|---|---|---|
| TW | I327317 B | 7/2010 |
| TW | 201939497 A | 10/2019 |
| WO | 2022040028 | 2/2022 |

OTHER PUBLICATIONS

U.S. Appl. No. 16/998,928 titled "Apparatuses, Systems, and Methods for Ferroelectric Memory Cell Operations" filed Aug. 20, 2020, pp. all pages of application as filed.

(Continued)

*Primary Examiner* — Han Yang
(74) *Attorney, Agent, or Firm* — Dorsey & Whitney LLP

(57) ABSTRACT

At least one portion of a memory array may be arranged to provide high density non-volatile random access memory (HIGH DENSITY NON-VOLATILE RAM) while at least one other portion of the memory array may be arranged to provide dynamic random access memory (DRAM)-like memory. In some examples, the memory array may be arranged by programming one or more configuration devices. In some examples, the configuration device may include one or more switches to couple one or more memory cells to a sense amplifier. In some examples, the configuration device may include fuses and/or antifuses to couple one or more memory cells to a sense amplifier. In some examples, the portions of the memory array may be reconfigurable from one arrangement to another arrangement.

33 Claims, 9 Drawing Sheets

(56) References Cited

U.S. PATENT DOCUMENTS

| | | |
|---|---|---|
| 2003/0107912 A1* | 6/2003 | Derner .................. G11C 17/12 |
| | | 365/149 |
| 2003/0223292 A1 | 12/2003 | Nejad et al. |
| 2004/0184307 A1 | 9/2004 | Saito |
| 2008/0037344 A1* | 2/2008 | Kobayashi .......... G11C 11/4094 |
| | | 365/201 |
| 2009/0129186 A1* | 5/2009 | Schnell .................. G11C 5/04 |
| | | 365/201 |
| 2013/0070506 A1 | 3/2013 | Kajigaya |
| 2014/0119090 A1 | 5/2014 | Ahn et al. |
| 2014/0347912 A1 | 11/2014 | Siau et al. |
| 2015/0016175 A1 | 1/2015 | Evans et al. |
| 2016/0020255 A1 | 1/2016 | Ratnam et al. |
| 2019/0035464 A1 | 1/2019 | Kajigaya |
| 2020/0235111 A1 | 7/2020 | Calderoni et al. |
| 2021/0272620 A1 | 9/2021 | Barry |
| 2022/0059151 A1 | 2/2022 | Vimercati |
| 2022/0254399 A1 | 8/2022 | Vimercati |

OTHER PUBLICATIONS

U.S. Appl. No. 17/189,594, titled "Memory Devices and Methods of Forming Memory Devices", filed Mar. 2, 2021; pp. all pages of application as filed.

U.S. Appl. No. 17/661,348, titled "Apparatuses, Systems, and Methods for Ferroelectric Memory Celloperations", filed Apr. 29, 2022; pp. all pages of application as filed.

* cited by examiner

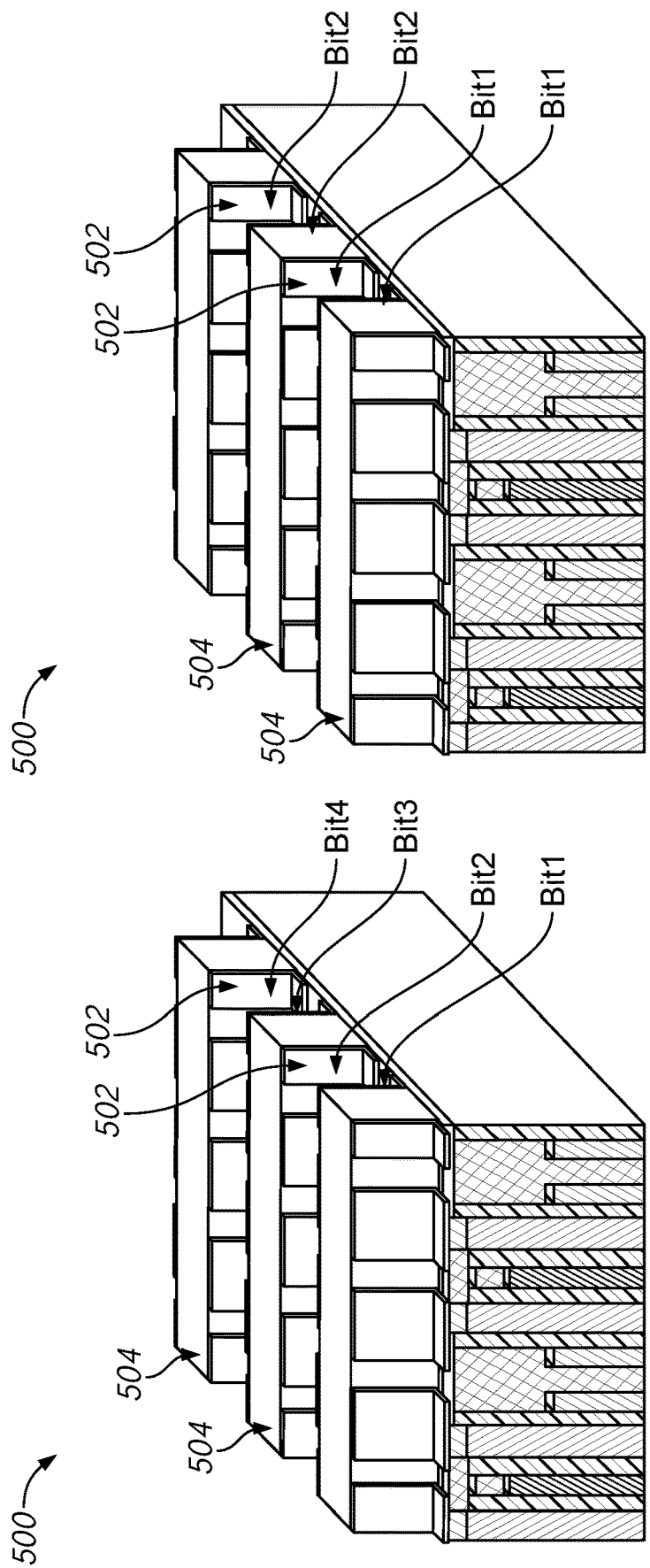

APPARATUSES, SYSTEMS, AND METHODS FOR CONFIGURABLE MEMORY

BACKGROUND

This disclosure relates generally to semiconductor devices, such as semiconductor memory devices. The semiconductor memory device may include a number of memory cells which are used to store information (e.g., a bit having a logic state of '0' or '1'). Memory cells may store a physical signal, such as a charge, which may be used to represent the stored information. For example the memory cell may store a binary bit as charge on a capacitive element, with a first level of charge representing a low logical level, and a second level of charge representing a high logical level.

Different types of memory cells may store the physical signal in different ways (e.g., by using different types of capacitive elements). The different types of memory cells may have different access speeds and costs. For example, dynamic random access memory (DRAM) is high performance volatile memory. DRAM may have access speeds between 50-100 ns. In contrast, flash memory is lower performing nonvolatile memory. Flash may have access speeds in the 100 k-2,000 k ns, but may have a cost that is significantly less than DRAM (e.g., 5% to 10% the cost of DRAM). Memory devices that provide improved performance over flash memory with costs below DRAM may be desired for certain applications.

BRIEF DESCRIPTION OF THE DRAWINGS

FIGS. 6A and 6B are perspective views of a portion of the FeRAM device shown in FIG. 5.

DETAILED DESCRIPTION

Figure 1:
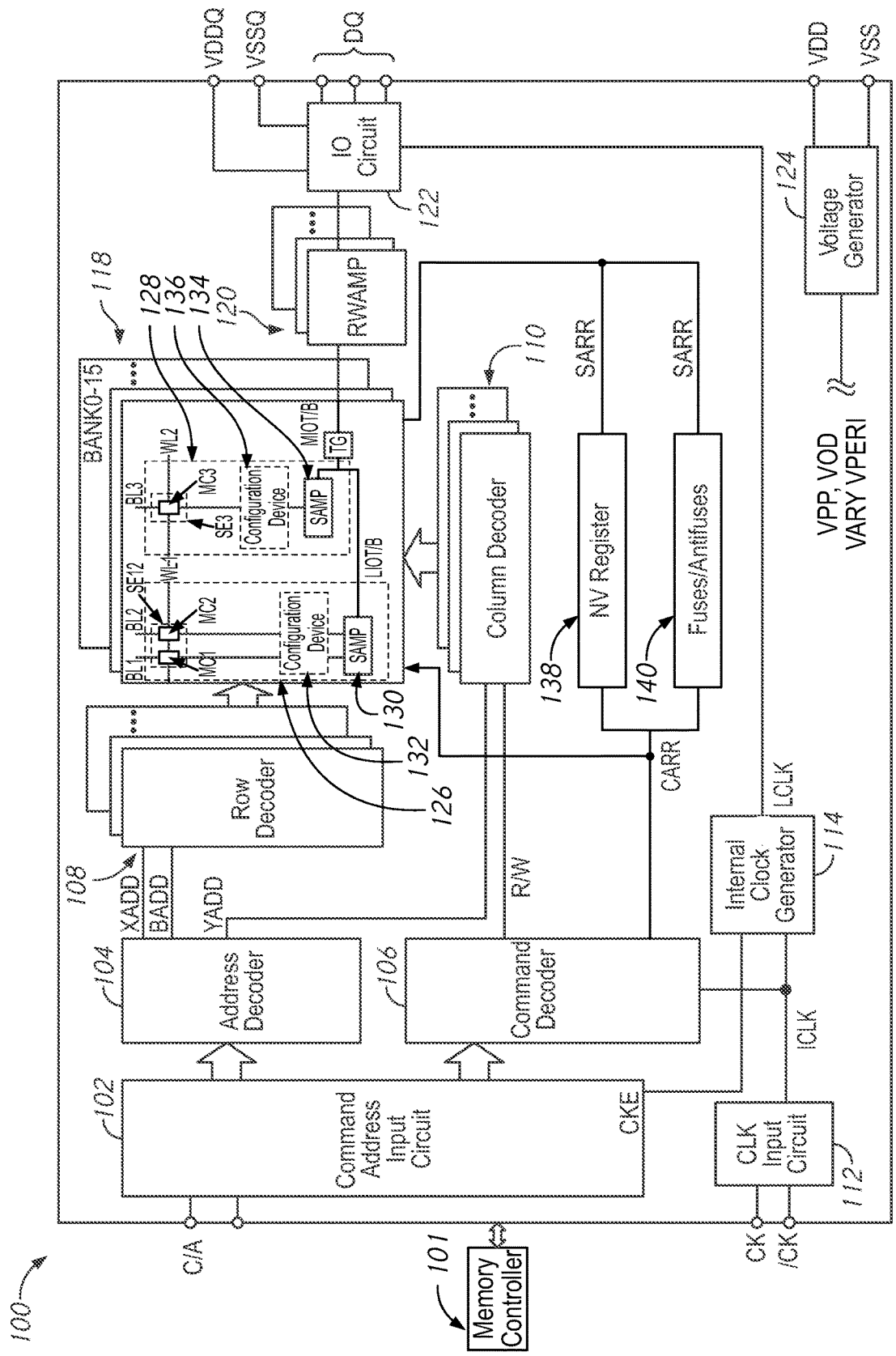
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present apparatuses, systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed apparatuses, systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

According to embodiments of the present disclosure, a memory device may be arranged such that at least one portion of a memory device provides higher density non-volatile random access memory (RAM) and at least one other portion of the memory device provides DRAM-like memory. In some embodiments, a portion may include a bank of a memory array. In some embodiments, commands and/or control signals may be used to arrange the portions of the memory device. In some embodiments, the memory device may be reconfigurable such that portions and/or sizes of the portions that provide higher density non-volatile RAM and DRAM-like memory can be changed. In some embodiments, the portions dedicated to higher density non-volatile RAM and DRAM-like memory may be arranged by setting (e.g., programming) switches, fuses, antifuses, and/or a writing one or more values to a nonvolatile register.

The memory devices disclosed herein may allow different levels of performance to be achieved on a single die and/or chip in some applications. The memory devices disclosed herein may allow the memory array to be arranged to provide a desired ratio between higher density non-volatile RAM and DRAM-like memory, which may allow the memory devices to meet the performance needs of a wide variety of applications.

A memory device may include a memory array which has a number of memory cells, each located at the intersection of a word line (e.g., row) and digit line (e.g., bit line, column). During a read or write operation, a row may be activated, and data may be read from, or written to, the memory cells along the activated row. Each memory cell stores information (e.g., a bit) as a physical signal, such as charge. For example, ferroelectric memory (FeRAM) cells may use a ferroelectric material as part of a capacitive element, which may be charged as part of a write operation. During a write operation, voltage may be applied to the memory cell, which may build up charge on the memory cell. During a read operation, the charge may produce a voltage on a signal line (e.g., a digit line) coupled to the memory cell. After the charge in the memory cell changes the voltage on the digit line, the voltage on the digit line may then be compared to a reference to determine if the information stored in the memory cell was a high or low value. The high and low values may correspond to logic states (e.g., '0' and '1').

FeRAM typically has greater performance than flash memory and may be approximately half the cost of DRAM. Accordingly, FeRAM may provide a cost-effective solution for improved performance in some applications.

FIG. 1 is a block diagram of a semiconductor device according an embodiment of the disclosure. The semiconductor device 100 may be a semiconductor memory device integrated on a single semiconductor chip in some embodiments. In some embodiments, semiconductor device 100 may include a FeRAM device.

The semiconductor device 100 includes a memory array 118. The memory array 118 is shown as including multiple memory banks BANK0-15. In the embodiment of FIG. 1, sixteen banks are shown, however more or fewer banks may be used in other embodiments. Each memory bank includes multiple word lines WL, multiple bit lines BL (e.g., digit lines), and multiple memory cells MC arranged at intersections of the word lines WL and the bit lines BL. The selection of the word line WL is performed by a row decoder 108 and the selection of the bit lines BL is performed by a column decoder 110. In some embodiments, certain components such as the command/address input circuit 102 may be shared by all the banks, while components such as the row decoder 108 may be bank specific. In the embodiment of FIG. 1, the row decoder 108 includes a respective row decoder for each memory bank and the column decoder 110 includes a respective column decoder for each memory bank.

Different portions of the memory array 118 may have different arrangements (e.g., configurations) as shown by boxes 326 and 328. In the arrangement shown in box 326, multiple memory cells MC1, MC2 along a word line WL are coupled to bit lines BL1 BL2, respectively. The bit lines BL1, BL2 may couple the memory cells MC1, MC2 to a sense amplifier SAMP 130. The charges stored on memory cells MC1 and MC2 may be sensed together (e.g., they may be connected to the sense amplifier SAMP 130 at the same, or nearly the same, time). Thus, memory cells MC1, MC2 may not be independent and combined together constitute a single storage element SE12. Although two memory cells MC1, MC2 are shown in the example in FIG. 1, in other examples, more than two memory cells may be coupled to sense amplifier SAMP 130. In the arrangement shown in box 128, a memory cell MC3 on a word line WL is coupled to a sense amplifier SAM 134 by bit line BL3. In this arrangement, individual memory cells may act as separate storage elements, such as memory cell MC3 acting as storage element SE3.

In some applications, the arrangement shown in box 126 may provide DRAM-like performance and the arrangement shown in box 128 may provide higher density non-volatile RAM. The storage density of the portion of the memory array 118 arranged as shown in box 128 may be greater than the arrangement shown in box 126 since each memory cell independently stores information (e.g., each memory cell stores a bit) in the arrangement of box 128, whereas multiple memory cells are utilized to store information (e.g., a bit) in the arrangement of box 126. In some applications, the performance of the arrangement shown in box 126 and the performance of the arrangement shown in box 128 may be different. For example, the access speed of the arrangement shown in box 126 may be faster than for the arrangement shown in box 128. In another example, the arrangement shown in box 128 may provide higher memory density than for the arrangement shown in box 126.

In some embodiments, the memory array 118 may further include configuration devices 132 and 136 coupled between the sense amplifiers and the bit lines. The configuration devices 132, 136 may be programmed to arrange the portion of the memory as shown in box 126 or box 128 in some embodiments. In some embodiments, the configuration devices 132, 136 may each include one or more switches. In some embodiments, the configuration devices 132, 136 may include a multiplexer. In some embodiments, the configuration devices 132, 136 may include one or more fuses and/or antifuses. Although only one sense amplifier is shown coupled to the configuration device in the two example arrangements shown in box 126 and 128, the configuration device 132 and/or configuration device 136 may couple multiple sense amplifiers to multiple memory cells in the selected arrangement.

Although the arrangements shown in boxes 126 and 128 are illustrated in a single bank, in some embodiments, an entire bank may have a single arrangement. For example, BANK0-12 may have the arrangement shown in box 126 and BANK13-15 may have the arrangement shown in box 128, or vice versa. In another example, BANK0-2 and BANK 5 may have the arrangement shown in box 126 and the remaining banks may have the arrangement shown in box 128, or vice versa. Other combinations of arrangements may be used in other examples. In some embodiments, entire bank groups may have a single arrangement. In some embodiments, sub-portions of the banks may have a single arrangement (e.g., mats, sub-mats). In some embodiments, the memory array 118 may include a single configuration device 132 or 136 that couples all of the sense amplifiers and memory cells of the memory array 118 in the selected arrangement(s). In some embodiments, the memory array 118 may include multiple configuration devices 132, 136. For example, each portion (e.g., each bank group, each bank, and/or each mat) may include one or more configuration devices. In some embodiments, the number of configuration devices may be equal to the number of portions of the memory array 118.

The bit lines BL1 and BL2, and bit line BL3 are coupled to respective sense amplifiers (SAMP). Read data from the bit lines BL1 and BL2, and bit line BL3 are amplified by the sense amplifiers SAMP, and transferred to read/write amplifiers (RW AMP) 120 over complementary local data lines (LIOT/B), transfer gate (TG), and complementary main data lines (MIOT/B) which are coupled to a read/write amplifier RW AMP 120. Conversely, write data output from the RW AMP 120 is transferred to the sense amplifiers SAMP over the complementary main data lines MIOT/B, the transfer gate TG, and the complementary local data lines LIOT/B, and written in the memory cell MC coupled to the bit line BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed. As another example, commands may be provided to arrange (e.g., configure) the memory array 118 in some embodiments, such as the arrangements shown in boxes 126 and 128. In some embodiments, the commands may be provided by a memory controller 101. In some embodiments, the device 100 and memory controller 101 may be included in a system (e.g., a computing system).

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

According to embodiments of the present disclosure, the commands may include arrangement commands CARR to write values in a nonvolatile (NV) register 138, set fuses/antifuses 140, and/or program configuration devices 132, 136 to arrange memory array 118 (e.g., the arrangements shown in boxes 126 and 128). In some embodiments, the NV register 138 and/or fuses/antifuses 140 may provide control signals SARR to program the configuration devices 132, 136 to arrange memory array 118. In some embodiments, the NV register 138 may not provide control signals SARR, but may store data regarding which portions of the memory array 118 have which arrangement (e.g., which banks have the arrangement shown in box 126 and which banks have the arrangement shown in box 128). In some embodiments, the NV register 138 may store data regarding which portions of the memory array 118 have which arrangement and provide control signals SARR. Although shown separately in FIG. 1, in some embodiments, one or more of the fuses/antifuses 140 may be located in configuration devices 132, 136.

In some embodiments, the arrangement commands may permanently arrange the memory array 118. In these embodiments, the arrangement commands may cause portions of the memory array 118 (e.g., banks) to be arranged according to corresponding arrangements, and once the portions have been arranged, the portions cannot be reconfigured (e.g., rearranged) to be in a different arrangement (e.g., once a bank is arranged as shown in box 126, it cannot be rearranged to be in the arrangement shown in box 128). In some embodiments, the arrangement commands may not permanently arrange the memory array 118 and additional arrangement commands may be provided to reconfigure the memory array 118 (e.g., a bank may initially be arranged as shown in box 126 and later rearranged as shown in box 128).

Optionally, in some embodiments, the memory array 118 may be permanently arranged during one or more stages of the fabrication of device 100. In these embodiments, the portions of the memory array 118 arranged in various arrangements (e.g., arrangements shown in boxes 126 and 128) may be pre-defined. For example, the configuration devices 132, 136 may be hardwired in some embodiments. In some embodiments when the memory array 118 is predefined, the NV register 138 and/or fuses/antifuses 140 may be omitted.

Although not shown in FIG. 1, the portions of the memory array 118 may be coupled to different signals and drivers to accommodate different operations of the different arrangements. For example, digit lines of a first portion having one memory arrangement may be charged to a first reference voltage as part of the read operation, while the digit lines of a second portion having another memory arrangement may be charged to a different reference voltage as part of the read operation. Accordingly, there may be differences between the digit line drivers of the first and second portions. Similarly, different clock signals may be used for access operations in the portions with different arrangements, since the different portions may be accessed with different speeds. In some embodiments, different error correction coding (ECC) may be used for the different memory arrangements.

The device 100 may receive an access command which is a read command. When a read command is received, and a bank address, a row address and a column address are timely supplied with the read command, read data is read from memory cells of storage elements in the memory array 118 corresponding to the row address and column address. The read command is received by the command decoder 106, which provides internal commands so that read data from the memory array 118 is provided to the RW AMP 120. The read command may also cause one or more parity bits associated with the read data to be provided along the MIOT/B to the RW AMP 120. The read/write amplifiers RW AMP 120 may provide amplified data bits to the I/O circuit 122, which may provide the read data outside the device 100 from the data terminals DQ.

The device 100 may receive an access command which is a write command. When the write command is received, and a bank address, a row address and a column address are timely supplied with the write command, and write data is supplied through the DQ terminals to the read/write amplifier 120. The write data supplied to the data terminals DQ is written to a memory cells of storage elements in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 322 to the read/write amplifier 120. The RW AMP 120 may provide the write data to the memory array 118 to be written into the memory cells MC of storage elements SE.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2A:
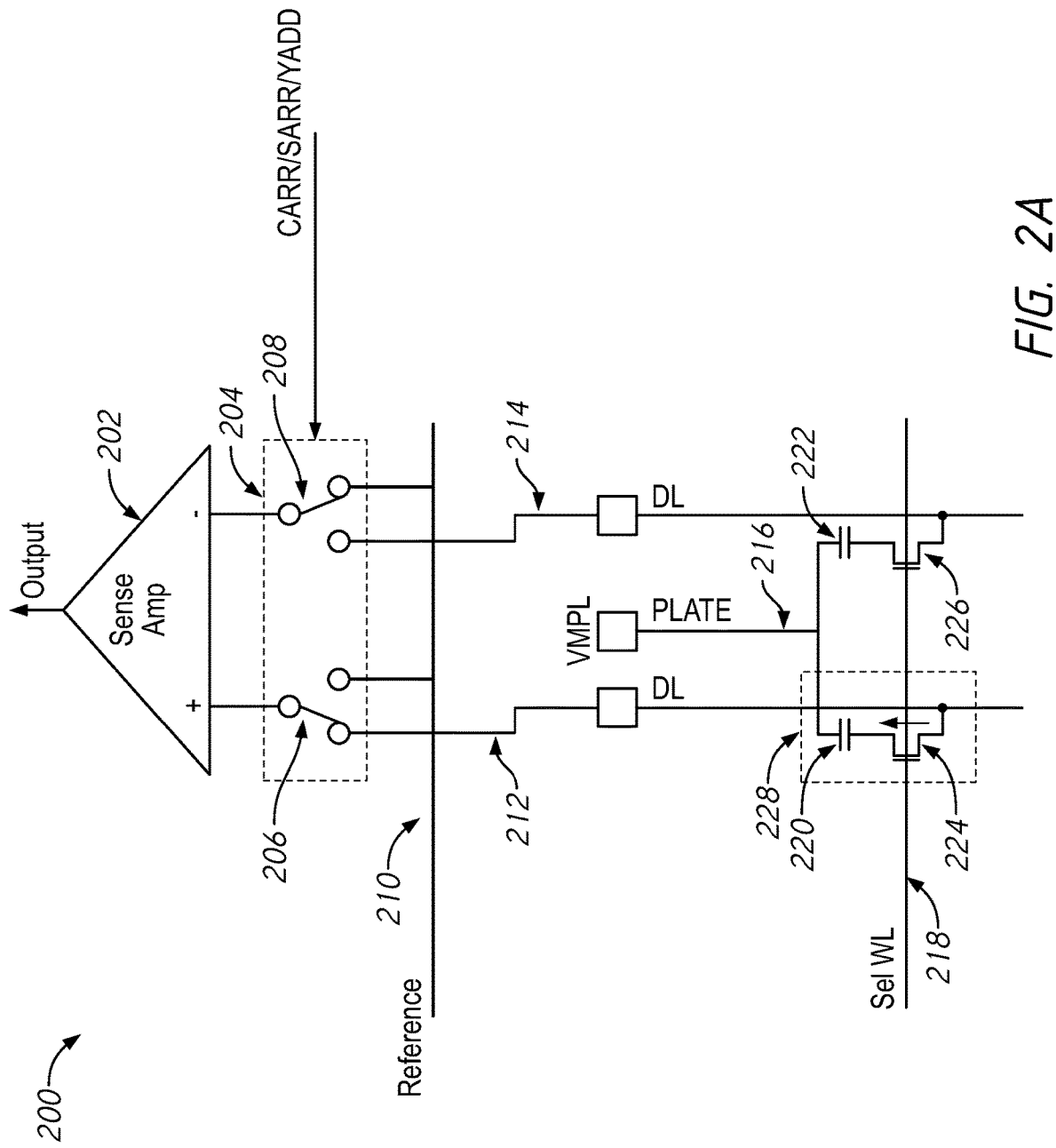
FIGS. 2A-C include circuit diagrams of at least a portion of a memory array including a configuration device according to at least one embodiment of the disclosure.
Figure 2B:
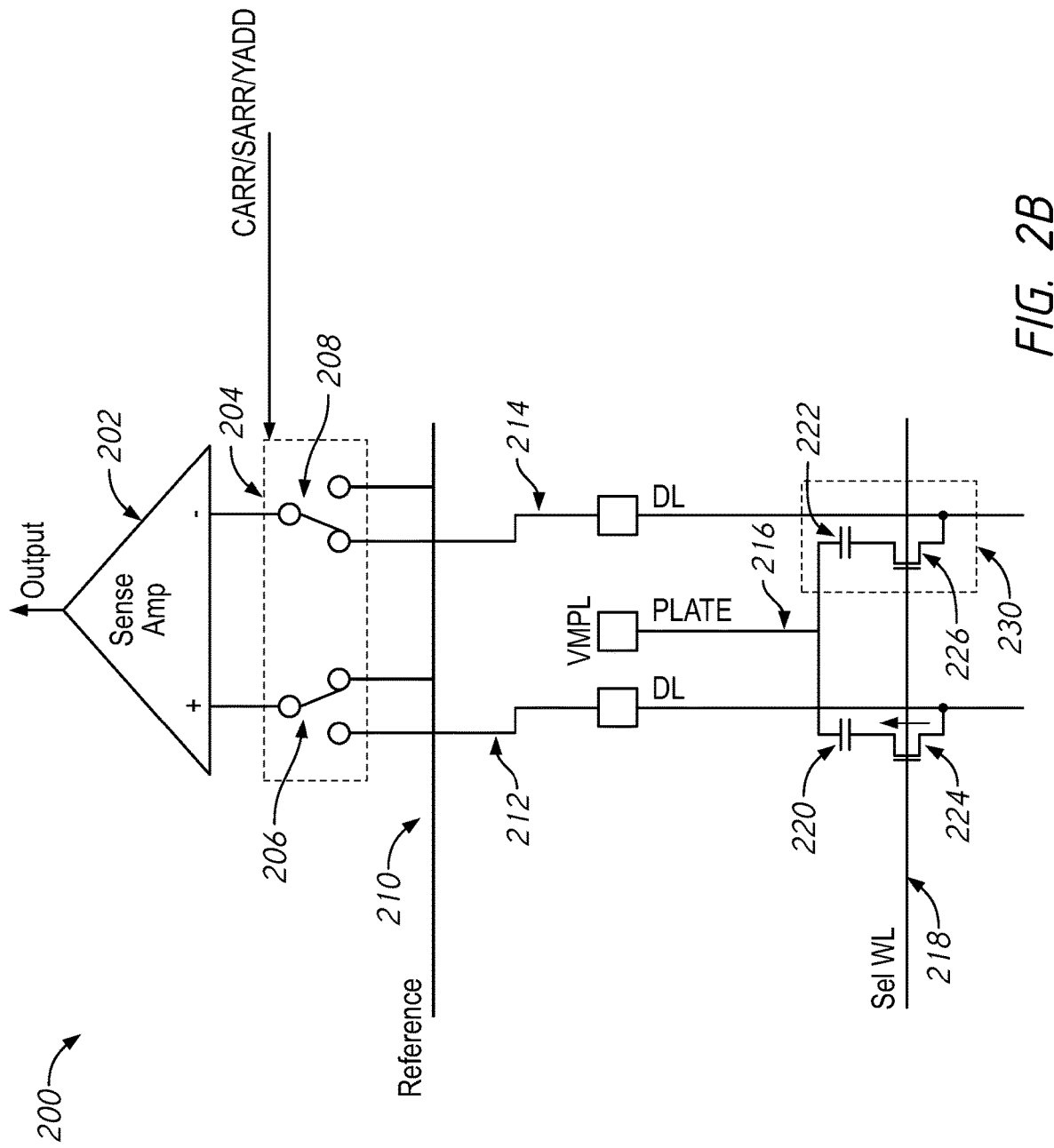
Figure 2C:
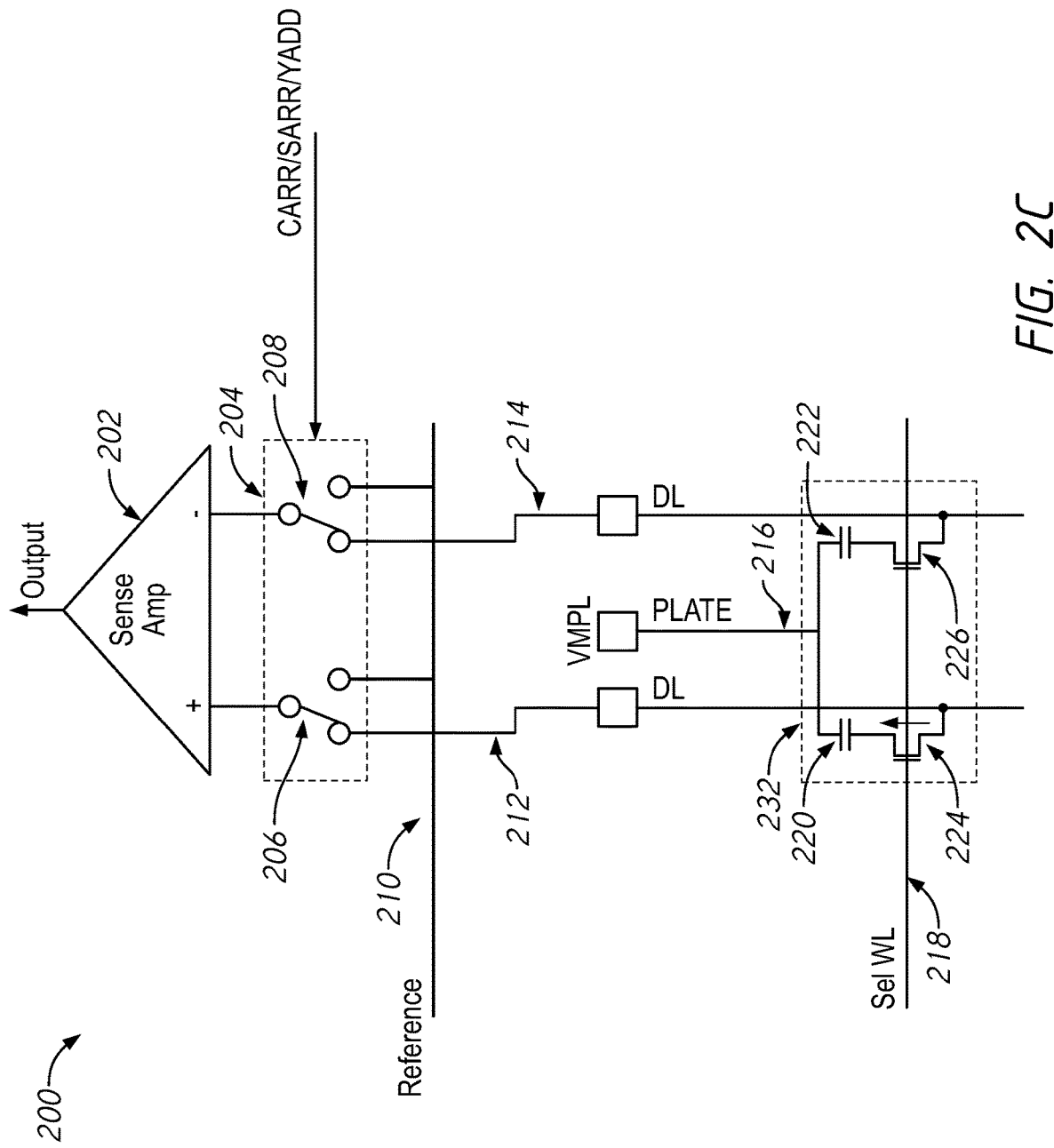

FIGS. 2A-C include circuit diagrams of at least a portion of a memory array including a configuration device according to at least one embodiment of the disclosure. In some embodiments, the memory array 200 may be included in memory array 218. The portion of the memory array 200 shown in FIGS. 2A-C includes a sense amplifier 202, a configuration device 204, a reference potential line 210, digit lines 212, 214, a plate 216, a word line (WL) 218, memory cells 220, 222, and selector devices 224, 226.

The sense amplifier 202 may be coupled to memory cell 220 and/or memory cell 222 via the digit lines 212, 214 through configuration device 204. In some embodiments, the sense amplifier 202 may be included in sense amplifier 130 and/or 134. In some embodiments, the digit lines 212, 214 may correspond to bit lines BL1, BL2, and/or BL3. In some embodiments, the configuration device 204 may be included in configuration device 132 and/or 136. In some embodiments, such as the one shown in FIGS. 2A-C, the configuration device 204 may include switches 206 and 208. In some embodiments, configuration device 204 may only be a portion of a larger configuration device that spans more sense amplifiers and memory cells not shown in FIGS. 2A-C (e.g., an entire memory array or bank of a memory array). In some embodiments, the memory cells 220, 222 may be included in memory cells MC1, MC2, and/or MC3.

In some embodiments, the memory cells 220 and 222 are coupled by plate 216. Plate 216 may be coupled to a plate potential VMPL in some embodiments. The selector device 224 may be coupled between memory cell 220 and digit line 212. The selector device 226 may be coupled between memory cell 222 and digit line 214. The selector devices 224 and 226 may be further coupled to the word line 218. The word line 218 may correspond to WL1, WL2, and/or WL3 in some embodiments. The word line 218 may activate the selector devices 224 and 226 when the word line 218 is selected (e.g., a high logic level is provided on the word line 218). When the selector devices 224, 226 are activated by the word line 218, the memory cells 220 and 222 may be connected to their respective digit lines 212, 214.

Whether memory cell 220, memory cell 222, or both memory cells are connected to the sense amplifier 202 by the configuration device 204 may depend on an arrangement of the portion of the memory array 200. The arrangement may be based, at least in part, on arrangement commands CARR and/or arrangement control signals SARR received by the configuration device 204. In some embodiments, the arrangement commands CARR may be provided by a command decoder, such as command decoder 106. In some embodiments, the arrangement control signals SARR may be provided by a NV register such as NV register 138 and/or fuses/antifuses such as fuses/antifuses 140.

FIGS. 2A and 2B illustrate the portion of the memory array 200 according to an arrangement according to at least one embodiment of the disclosure. The arrangement shown in FIGS. 2A and 2B may correspond to the arrangement shown in box 128. In this arrangement, each memory cell 220, 222 acts as an independent storage elements 228, 230, respectively. For example, memory cell 220 may store one bit and memory cell 222 may store another bit. Each memory cell 220, 222 is sensed separately by the sense amplifier 202 in some embodiments.

As shown in FIGS. 2A and 2B, the configuration device 204 may connect one input of the sense amplifier 202 to a digit line 212 or 214 and connect another input of the sense amplifier 202 to the reference potential line 210, which may provide a reference potential. In this arrangement, the sense amplifier 202 may act as a unipolar sense amplifier. The sense amplifier 202 may compare the signal provided from the memory cell 220 or memory cell 222 to the reference potential and provide an output signal based on the comparison.

In this arrangement, the configuration device 204 may further receive and respond to an address signal, such as a column address signal YADD. The configuration device 204 may selectively connect either memory cell 220 or memory cell 222 to the sense amplifier 202 based, at least in part, on the address signal.

As shown in FIG. 2A, memory cell 220 may be selected as the storage element 228 when the word line 218 is selected and the address signal YADD indicates a column that includes memory cell 220. Responsive, at least in part, to the address signal YADD, the configuration device 204 may cause switch 206 to connect an input of the sense amplifier 202 to digit line 212, thus connecting memory cell 220 to the input of the sense amplifier 202. The configuration device 204 may further cause switch 208 to connect another input of the sense amplifier 202 to reference potential line 210. The sense amplifier 202 may sense a charge on memory cell 220 and compare it to the reference potential on reference potential line 210 and provide an output signal based on the comparison. The output signal may be provided to a local data line such as LIOT/B shown in FIG. 1.

Turning to FIG. 2B, memory cell 222 may be selected as storage element 430 when the word line 218 is selected and the address signal YADD indicates a column that includes memory cell 222. Responsive, at least in part, to the address signal YADD, the configuration device 204 may cause switch 208 to connect an input of the sense amplifier 202 to digit line 214, thus connecting memory cell 222 to an input of the sense amplifier 202. The configuration device 204 may further cause switch 206 to connect another input of the sense amplifier 202 to reference potential line 210. The sense amplifier 202 may sense a charge on memory cell 222 and compare it to the reference potential on reference potential line 210 and provide an output signal based on the comparison.

The arrangement shown in FIGS. 2A and 2B may be referred to as a one-transistor-one-capacitor (1T1C) architecture as the storage elements 228 and 230 in these examples may each include one transistor (e.g., devices 224 and 226, respectively) and one capacitor (e.g., memory cells 220 and 222, respectively).

FIG. 2C illustrates the portion of the memory array 200 according to an arrangement according to at least one embodiment of the disclosure. The arrangement shown in FIG. 2C may correspond to the arrangement shown in box 126. In this arrangement, the memory cells 220, 222 together act as a single storage element 232. For example, memory cells 220, 222 together may store a bit. The memory cells 220, 222 may be sensed together by the sense amplifier 202 in some embodiments.

As shown in FIG. 2C, responsive, at least in part, to the CARR and/or SARR signals, the configuration device 204 may connect one input of the sense amplifier 202 to digit line 212 via switch 206 and connect another input of the sense amplifier 202 to digit line 214 via switch 208. In this arrangement, the sense amplifier 202 may act as a differential sense amplifier. The sense amplifier 202 may compare the signal provided from the memory cell 220 and the memory cell 222 and provide an output signal based on the comparison. The output signal may be provided to a local data line such as LIOT/B shown in FIG. 1. In the example shown in FIG. 2C, in this arrangement, the reference potential line 210 may not be coupled to the sense amplifier 202.

Memory cells 220, 222 may be selected when the word line 218 is selected and a column that includes memory cells 220, 222 is selected (e.g., a column including digit lines 212 and 214). In the arrangement shown in FIG. 2C, the configuration device 204 may not receive and/or may not respond to an address signal, such as a column address signal YADD. The sense amplifier 202 may sense a charge on memory cell 220 and a charge on memory cell 222 and provide the output signal.

A variety of storage techniques may be used to utilize memory cell 220 and 222 as a single storage element 232. For example, in some embodiments, memory cell 220 and memory cell 222 may store a same charge to indicate one logic value (e.g., '0' or '1') and store different charges to indicate another logic value. In these examples, when the sense amplifier 202 detects a difference between the charges in the memory cells 220, 222, the sense amplifier 202 outputs a signal indicating one logic value (e.g., '0') and when the sense amplifier 202 detects little or no difference between the charges in the memory cells 220, 222, the sense amplifier 202 outputs a signal indicating the other logic value (e.g., '1'). In another example, the memory cells may store different charges to indicate different logic values. In these examples, when the sense amplifier 202 detects a difference having a polarity (e.g., the charge in memory cell 220 is greater than the charge in memory cell 222), the sense amplifier 202 outputs a signal indicating one logic value (e.g., '0') and when the sense amplifier 202 detects a difference having a different polarity (e.g., the charge in memory cell 220 is less than the charge in memory cell 222), the sense amplifier 202 outputs a signal indicating another logic value (e.g., '1'). Other storage techniques may be used in other examples.

The arrangement shown in FIG. 2C may be referred to as a two-transistor-two-capacitor (2T2C) architecture as the storage element 232 in some examples may include two transistor (e.g., devices 224 and 226) and two capacitors (e.g., memory cells 220 and 222).

In some applications, the signal provided by the memory cells 220 and 222 as a single storage element 232 as shown in FIG. 2C may be greater (e.g., great magnitude, greater signal margin, etc.) than the signals provided by the memory cells 220, 222 individually as shown in FIGS. 2A and 2B. The greater signal provided by storage element 432 (e.g., the signals provided by memory cells 220, 222) may allow the sense amplifier 202 to sense the information stored in storage element 232 faster than the information stored individually in memory cells 220, 422 (e.g., acting as storage elements 228 and 230). Thus, while the arrangement shown in FIGS. 2A and 2B provide greater storage density, the arrangement shown in FIG. 2C may provide faster access speed in some applications.

By providing configuration device 204, portions of the memory array 200 may be arranged as shown in FIGS. 24A and 2B and other portions of the memory array 200 may be arranged as shown in FIG. 2C. This may allow the memory array 200 to be arranged to provide a desired balance between storage density and performance.

In the embodiment shown in FIGS. 2A-C, the arrangement of the memory array 200 is based, at least in part, on the control of switches 206, 208, which may be controlled by various signals (e.g., CARR, SARR, YADD) provided to the configuration device 204. Thus, in some embodiments, memory array 200 may be reconfigurable by changing one or more of the signals provided to the configuration device 204. This may allow for flexibility if the appropriate balance between higher density and DRAM-like memory changes.

The embodiment shown in FIGS. 2A-C may require switches 206 and 208 to be flipped during access operations responsive to an address signal, such as YADD, to allow the memory cells 220 and 222 to be sensed separately by the sense amplifier 202 when arranged as shown in FIGS. 2A and 2B. In some applications, requiring frequent flipping of switches may further increase access time and/or reduce reliability of the memory array.

Figure 3A:
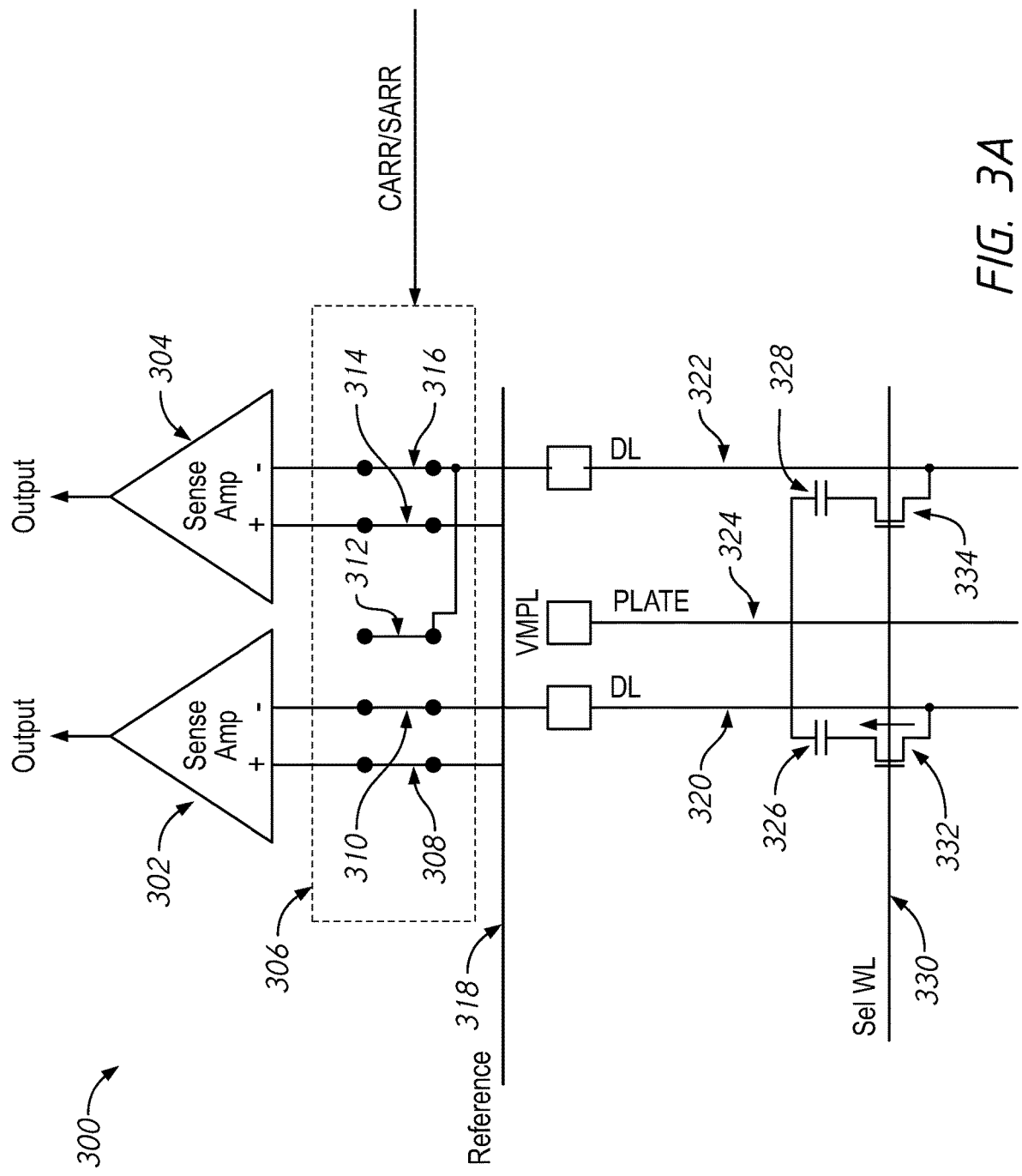
FIGS. 3A and 3B include circuit diagrams of at least a portion of a memory array including a configuration device according to at least one embodiment of the disclosure.
Figure 3B:
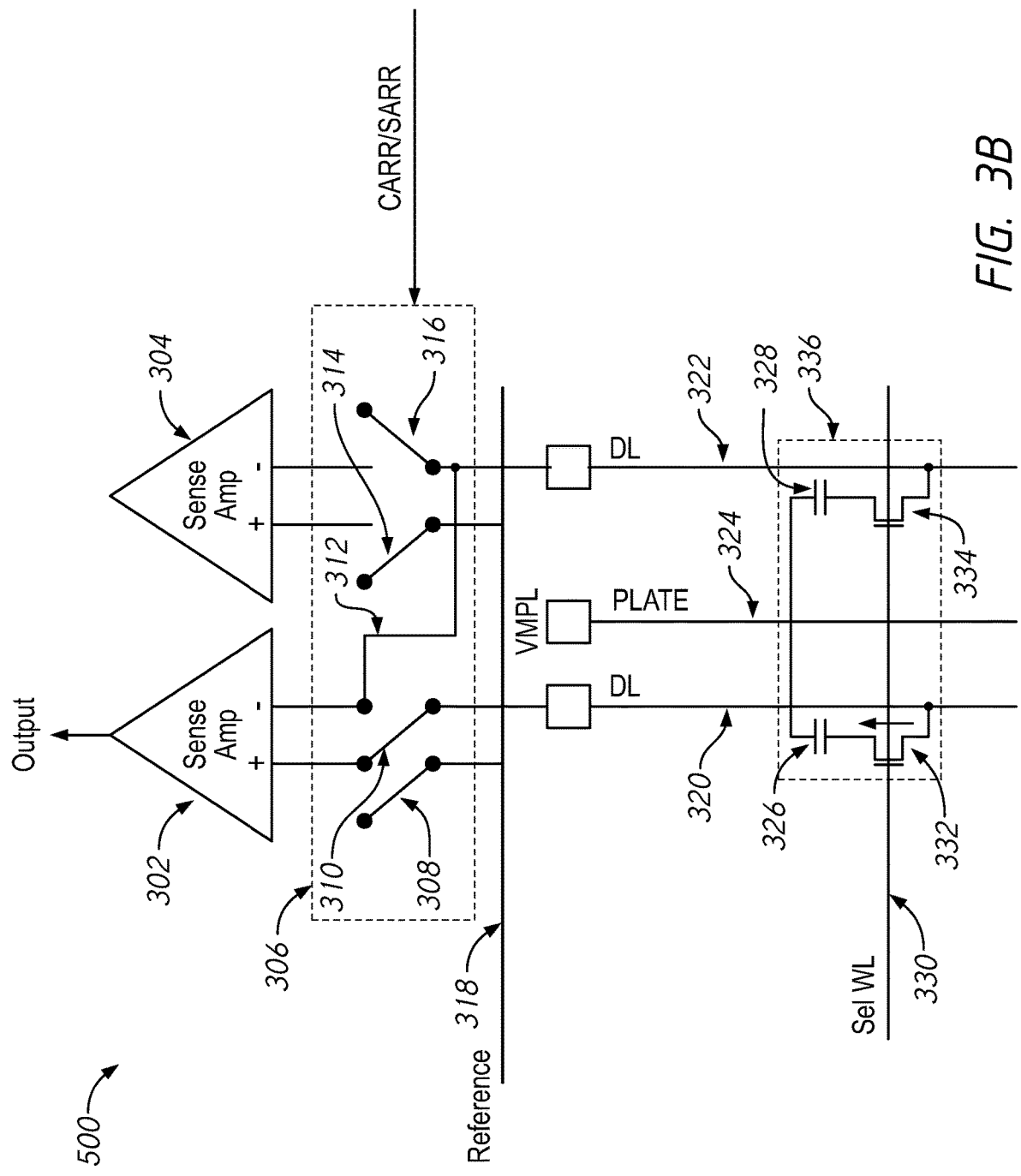

FIGS. 3A and 3B include circuit diagrams of at least a portion of a memory array including a configuration device according to at least one embodiment of the disclosure. In some embodiments, the memory array 300 may be included in memory array 118. The portion of the memory array 300 shown in FIGS. 3A and 3B includes sense amplifiers 302, 304, a configuration device 306, a reference potential line 318, digit lines 320, 322, a plate 324, a word line (WL) 330, memory cells 326, 328, and selector devices 332, 334.

In some embodiments, the sense amplifiers 502, 504 may be included in sense amplifier 130 and/or 134. In some embodiments, the digit lines 320, 322 may correspond to bit lines BL1, BL2, and/or BL3. In some embodiments, the configuration device 306 may be included in configuration device 132 and/or 136. In some embodiments, such as the one shown in FIGS. 3A and 3B, the configuration device 306 may include switches 308, 310, 312, 314, and 316. In some embodiments, configuration device 306 may only be a portion of a larger configuration device that spans more sense amplifiers and memory cells not shown in FIGS. 3A and 3B (e.g., an entire memory array or bank of a memory array). In some embodiments, the memory cells 326, 328 may be included in memory cells MC1, MC2, and/or MC3.

In some embodiments, the memory cells 326, 328 are coupled by plate 324. Plate 324 may be coupled to a plate potential VMPL in some embodiments. The selector device 332 may be coupled between memory cell 326 and digit line 320. The selector device 334 may be coupled between memory cell 328 and digit line 322. The selector devices 332 and 334 may be further coupled to the word line 330. The word line 330 may correspond to WL1, WL2, and/or WL3 in some embodiments. The word line 330 may activate the selector devices 332 and 334 when the word line 330 is selected (e.g., a high logic level is provided on the word line 330). When the selector devices 332, 334 are activated by the word line 330, the memory cells 326 and 328 may be connected to their respective digit lines 320, 322.

Whether memory cell 326, memory cell 328, or both memory cells are connected to the sense amplifier 302 and/or sense amplifier 304 by the configuration device 306 may depend on an arrangement of the portion of the memory array 300. The arrangement may be based, at least in part, on arrangement commands CARR and/or arrangement control signals SARR received by the configuration device 306. In some embodiments, the arrangement commands CARR may be provided by a command decoder, such as command decoder 106. In some embodiments, the arrangement control signals SARR may be provided by a NV register such as NV register 138 and/or fuses/antifuses such as fuses/antifuses 140.

FIG. 3A illustrates the portion of the memory array 300 according to an arrangement according to at least one embodiment of the disclosure. The arrangement shown in FIG. 3A may correspond to the arrangement shown in box 128. In this arrangement, each memory cell 326, 328 acts as an independent storage element. For example, memory cell 326 may store one bit and memory cell 328 may store another bit. Each memory cell 326, 328 is sensed separately by separate sense amplifiers 302 and 304, respectively, in some embodiments.

Responsive, at least in part, to the CARR and/or SARR signals, the configuration device 306 may connect an input of sense amplifier 302 to a reference potential line 318 via switch 308 and connect another input of sense amplifier 302 to digit line 320 via switch 310. The configuration device 306 may connect an input of sense amplifier 304 to the reference potential line 318 via switch 314 and connect another input of sense amplifier 304 to digit line 322 via switch 316. In the arrangement shown in FIG. 3A, switch 312 may float and/or be coupled to a potential that does not interfere with the connection between sense amplifier 304 and digit line 322. Furthermore, a different number and/or arrangement of switches may be used in other examples to achieve the connections for the present arrangement.

In this arrangement, sense amplifiers 302, 304 may act as unipolar sense amplifiers. Sense amplifier 302 may compare a charge stored on memory cell 326 to a reference potential provided on reference potential line 318 and provide an output signal based on the comparison. Similarly, sense amplifier 304 may compare a charge stored on memory cell 328 to the reference potential and provide an output signal based on the comparison. The output signals may be provide to local data lines, such as LIOT/B shown in FIG. 1.

FIG. 3B illustrates the portion of the memory array 300 according to an arrangement according to at least one embodiment of the disclosure. The arrangement shown in FIG. 3B may correspond to the arrangement shown in box 126. In this arrangement, the memory cells 326, 328 together act as a single storage element 336. For example, memory cells 326, 328 together may store a bit. The memory cells 326, 328 may be sensed together by a sense amplifier.

As shown in FIG. 3B, responsive, at least in part, to the CARR and/or SARR signals, the configuration device 306 may connect one input of the sense amplifier 302 to digit line 320 via switch 310 and connect another input of the sense amplifier 302 to digit line 322 via switch 312. Switches 308, 314, and 316 may float and/or connect to potentials that prevent the switches from interfering with the connections between the sense amplifier 302 and the digit lines 320, 322. Furthermore, a different number and/or arrangement of switches may be used in other examples to achieve the connections for the present arrangement.

In the arrangement shown in FIG. 3B, the sense amplifier 302 may act as a differential sense amplifier. The sense amplifier 302 may compare the signal provided from the memory cell 326 and the memory cell 328 and provide an output signal based on the comparison. The output signal may be provided to a local data line such as LIOT/B shown in FIG. 1.

In the example shown in FIG. 3B, in this arrangement, the reference potential line 318 may not be coupled to the sense amplifiers 302, 304, and the sense amplifier 304 is not coupled to the digit lines 320, 322. However, in other examples, the digit lines 320, 322 are coupled to sense amplifier 304, and sense amplifier 302 is not coupled to the digit lines 320, 322. Thus, in some embodiments, when the sense amplifiers are used as differential sense amplifiers, only one of the sense amplifiers (e.g., either sense amplifier 302 or 304) is used to sense storage element 336 (e.g., both memory cells 326, 328). A variety of storage techniques may be used to utilize memory cell 326 and 328 as a single storage element 536, such as those described with reference to memory cells 220 and 222 and storage element 232 shown in FIG. 2C.

In the embodiment shown in FIGS. 3A and 3B, the arrangement of the memory array 300 is based, at least in part, on the control of switches 308-316, which may be controlled by various signals (e.g., CARR, SARR) provided to the configuration device 306. Thus, in some embodiments, the memory array 300 may be reconfigurable by changing one or more of the signals provided to the configuration device 306. This may allow for flexibility if the appropriate balance between higher density and DRAM-like memory changes. In contrast to the memory array 200 shown in FIGS. 2A-C, the memory array 300 may not require switching between digit lines for access operations for different columns. However, in some embodiments, such as the one shown in FIGS. 3A and 3B, additional sense amplifiers may be included in the memory array 300 compared to memory array 200.

While memory array 300 reduces switching during access operations, in some applications, permitting rearrangement of the memory array may reduce reliability of the memory array. In these applications, it may be preferable to perform an initial arrangement of the memory array, and no rearrangement is permitted. Thus, once the arrangement of the memory array is programmed (e.g., set), it cannot be altered. In these embodiments, switches 308-316 may be permanently set and/or be replaced with fuses/antifuses (e.g., fuses/antifuses 140) that are set responsive to arrangement commands CARR and/or arrangement control signals SARR. For example, one bank of memory array 300 may be arranged as shown in FIG. 3A and another bank of memory array 300 may be arranged as shown in FIG. 3B by permanently setting switches and/or fuses/antifuses. Once arranged, the banks cannot be altered to be in another arrangement. These embodiments may be preferable to the reconfigurable embodiments shown in FIGS. 2A-C and FIGS. 3A and 3B in applications where reliability requirements are higher than flexibility requirements. However, allowing the memory array to be configured, even if permanently, by one or more arrangement commands may provide more flexibility than in embodiments, such as the one described with reference to FIG. 1, where the memory array may be permanently arranged during one or more stages of the fabrication of the memory array and/or device including the memory array.

Figure 4:
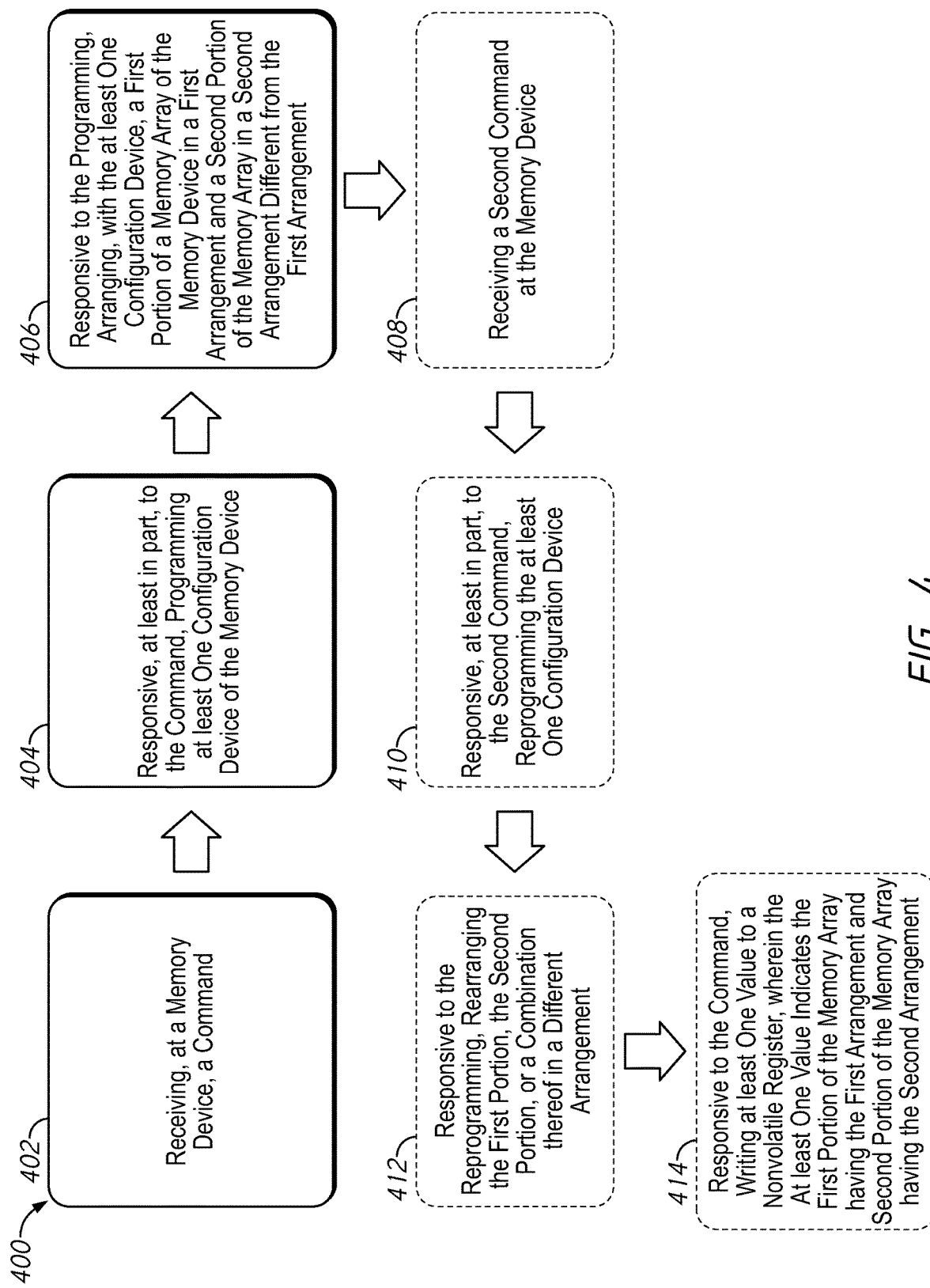
FIG. 4 is a flow chart of a method according to at least one embodiment of the disclosure.

FIG. 4 is a flow chart of a method according to at least one embodiment of the disclosure. In some embodiments, some or all of the method 400 may be performed by a semiconductor device, such as semiconductor device 100. In some embodiments, some or all of the method 400 may be performed by a memory array, such as memory array 118, 200, and/or 300.

At block 402, "receiving, at a memory device, a command" may be performed. In some embodiments, the command may be received at a command address input circuit, such as command address input circuit 102. In some embodiments, the command may be provided by a memory controller, such as memory controller 101.

At block 404, "responsive, at least in part, to the command, programming at least one configuration device of the memory device" may be performed. In some embodiments, programming the at least one configuration device may include setting at least one switch of the at least one configuration device, such as switches 206, 208, 308, 310, 312, 314, and/or 316. In some embodiments, programming the at least one configuration device may include setting at least one fuse, at least one antifuse, or a combination thereof of the at least one configuration device, such as fuses/antifuses 140.

At block 406, "responsive to the programming, arranging, with the at least one configuration device, a first portion of a memory array of the memory device in a first arrangement and a second portion of the memory array in a second arrangement different from the first arrangement" may be performed. In some embodiments, the first arrangement and/or the second arrangement may include the arrangement shown in box 126 or box 128. In some embodiments, arranging the first portion of the memory array in the first arrangement may include connecting a plurality of memory cells to a corresponding plurality of sense amplifiers, for example, as shown in FIG. 3A. In some embodiments, arranging the second portion of the memory array in the second arrangement may include connecting at least two memory cells to a sense amplifier, for example, as shown in FIGS. 2C and 3B.

In some embodiments, arranging the first portion of the memory array in the first arrangement may include selectively connecting individual ones of a plurality of memory cells to a plurality of sense amplifiers such that one of the plurality of memory cells is coupled to a corresponding one of the plurality of sense amplifiers at a time, for example, as shown in FIGS. 2A and 2B. In these embodiments, method 400 may further include receiving an access command and an address, responsive, at least in part, to the address, switching a memory cell of the plurality of memory cells connected to a sense amplifier of the plurality of sense amplifiers. For example, switches of the configuration device may change which memory cell is connected to a sense amplifier responsive to a column address YADD as shown in FIGS. 2A and 2B.

Optionally, in some embodiments, method 400 may further include performing "receiving a second command at the memory device" at block 408, performing "responsive, at least in part, to the second command, reprogramming the at least one configuration device" at block 410, and performing "responsive to the reprogramming, rearranging the first portion, the second portion, or a combination thereof in a different arrangement" at block 412. In other words, the memory array may be reconfigured as described with reference to the embodiments shown in FIGS. 2A-C and FIGS. 3A and 3B.

Optionally, in some embodiments, method 400 may further include performing "responsive to the command, writing at least one value to a nonvolatile register, wherein the at least one value indicates the first portion of the memory array having the first arrangement and second portion of the memory array having the second arrangement" as indicated by block 414. Although block 414 is shown after block 610, in some embodiments, block 414 may be performed at any time during method 400 after block 402.

Figure 5:
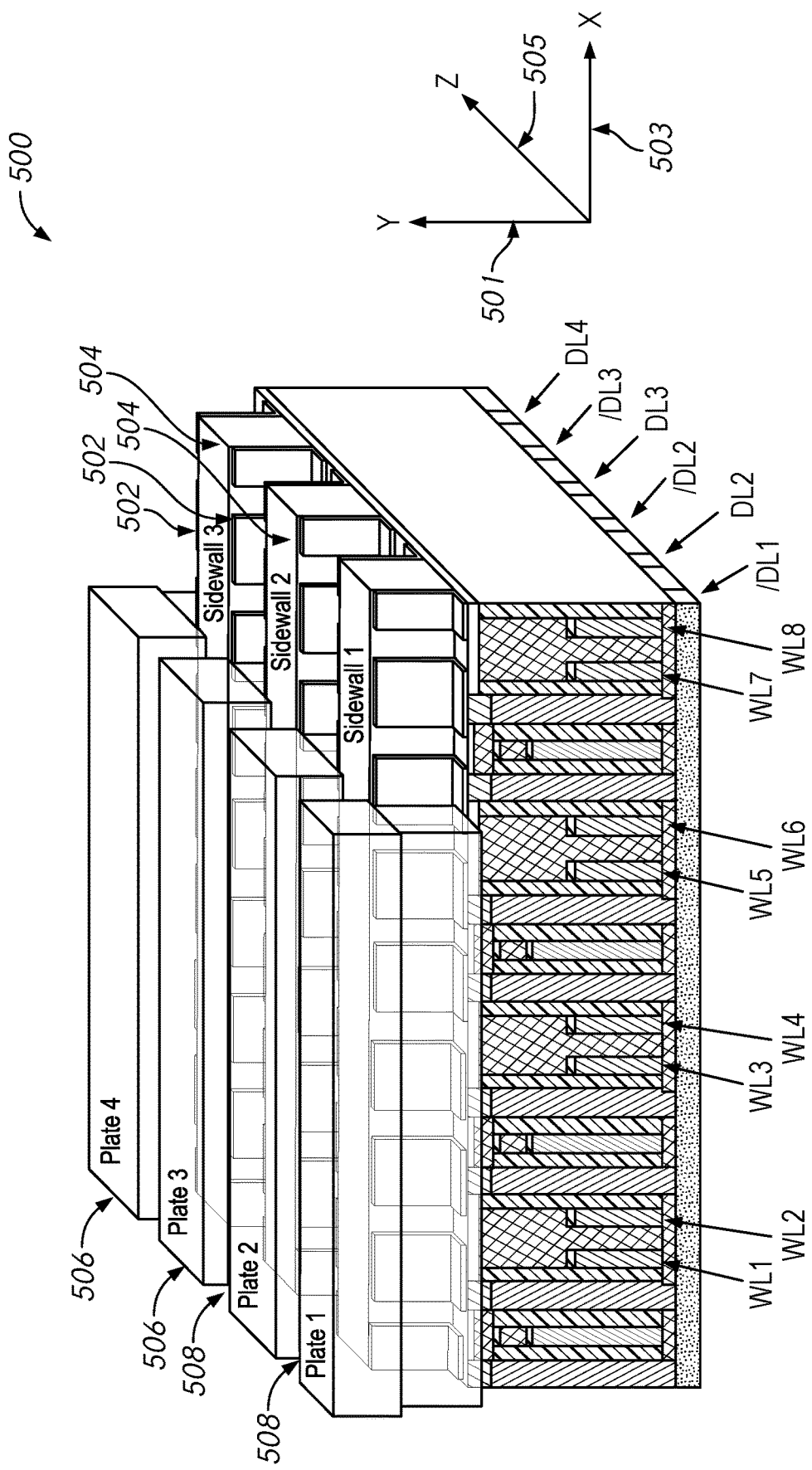
FIG. 5 is a block diagram of a semiconductor device according an embodiment of the disclosure.

FIG. 5 is a perspective view of at least a portion of an example ferroelectric memory (FeRAM) device. The FeRAM device 500 may higher density and/or DRAM-like memory in some examples. In some embodiments, the FeRAM device may be included in semiconductor device 100.

The FeRAM device 500 includes capacitors 502 arranged along sidewalls 504 in an array coupled to word lines WL1-8 extending in a first direction 503 and digit lines DL2-DL4 and /DL1-4 extending in a second direction 505 that is orthogonal to the first direction 503. In some examples, such as the one shown in FIG. 1, the digit lines may extend parallel to the sidewalls 104. The sidewalls 504 may be spaced apart and parallel in some examples, such as the one shown in FIG. 1. The capacitors 502 may include a ferroelectric material in some examples and may be included in memory cells, such as memory cell MC1-3 of FIG. 1, memory cells 220, 222 of FIG. 2, and/or memory cells 326, 328 of FIG. 3. The sidewalls 504 may include an insulating and/or dielectric material.

Plates 506 may extend along the first direction 503 parallel to the sidewalls 504 (only a portion of the plates 506 are shown in FIG. 5 in order to show sidewalls 504 and capacitors 502). One or more of plates 506 may be used to implement plate 216 and/or plate 324 in some embodiments. The plates 506 may extend between two adjacent sidewalls 504 and separated by plate cuts 508. Thus, the capacitors 502 along one side of a sidewall 504 may be coupled to the capacitors 502 along one side of another sidewall 504 via a plate 506. For example, the capacitors 502 on one side of Sidewall 2 504 are coupled to the capacitors 502 on one side of Sidewall 1 504 by Plate 2 506. Additionally, the capacitors 502 on the other side of Sidewall 2 504 are coupled to the capacitors 503 on one side of Sidewall 3 504 by Plate 3 506. Although the plate cuts 508 are shown every two digit lines in the example shown in FIG. 5, the plate cuts 508 may have different spacing in other examples (e.g., every 4, 8, 16 digit lines).

Additional details on the materials included in FeRAM device 500, the fabrication of FeRAM device 500, and operation of FeRAM device 100 may be found in U.S. Pat. No. 11,127,744 and U.S. patent application Ser. No. 17/189,594.

FIGS. 6A and 6B are perspective views of a portion of the FeRAM device shown in FIG. 5. As noted with reference to FIG. 5, the capacitors 502 may correspond to memory cells and hold charges corresponding to information stored therein. In some examples, the individual capacitors 502 may act as independent storage elements and store information associated with different bits indicated in FIG. 5A. As shown in FIG. 6A, each capacitor 502 may store a different one of Bits1-4 (in examples when capacitors 502 are multi-level memory cells, each capacitor 502 may store more than one bit). In some embodiments, the arrangement shown in FIG. 6A, may form a 1T1C architecture. In other examples, two or more capacitors 502 may be used store a Bit 1 or Bit 2 as shown in FIG. 6B. In these examples, the combined charge of the multiple capacitors may be used to store the information associated with the bit (in examples when capacitors 502 are multi-level memory cells, the charge on the multiple capacitors 502 may correspond to more than one bit). That is, multiple memory cells are used together as a storage element. In some embodiments, the arrangement shown in FIG. 6B may form a 2T2C architecture. In some examples, the FeRAM device 500 arranged as shown in FIG. 6A may provide higher density RAM while the FeRAM device 500 arranged as shown in FIG. 6B may provide DRAM-like performance.

As shown in FIGS. 6A and 6B, FeRAM device 500 has a semiconductor structure that may be arranged (e.g., configured) in multiple ways to provide a memory device that includes multiple performance levels on a same die and/or chip. For example, a portion of FeRAM device 500 may include a region of higher density and a region of DRAM-like memory. However, the amount of higher density RAM versus the amount of DRAM-like memory desired in a memory device may vary depending on the application. In some embodiments, the FeRAM device 500 may be configured as described with reference to FIGS. 1-4 to provide a desired arrangement of the FeRAM device 500 between higher density and DRAM-like portions.

The systems, apparatuses, and methods disclosed herein may allow arrangement of memory devices such that at least one portion of a memory device provides higher density RAM and at least one other portion of the memory device provides DRAM-like memory. As disclosed herein, the arrangement of the memory device may be achieved by providing one or more commands and/or control signals. In some examples, the commands and/or control signals may set switches to arrange the memory device. In some examples, the commands and/or control signals may set one or more fuses and/or antifuses. The apparatuses and methods disclosed herein may provide more flexibility for configuring (e.g., arranging) memory devices to include a desired ratio between higher density and DRAM-like memory.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a memory array;
at least one configuration device configured to arrange a first portion of the memory array in a first arrangement and arrange a second portion of the memory array in a second arrangement different than the first arrangement, wherein the first arrangement and the second arrangement are based, at least in part, on an arrangement command, wherein the first and second portions of the memory array each comprise a plurality of memory cells and at least one sense amplifier; and
a reference potential line, and wherein the at least one configuration device connects one memory cell of the plurality of memory cells to a first input of the at least one sense amplifier and further connects the reference potential line to a second input of the at least one sense amplifier in the first arrangement.

2. The apparatus of claim 1, wherein the at least one configuration device comprises at least one switch.

3. The apparatus of claim 1, wherein the at least one configuration device comprises a fuse, an antifuse, or a combination thereof.

4. The apparatus of claim 1, wherein the at least one sense amplifier comprises a unipolar sense amplifier in the first arrangement.

5. The apparatus of claim 1, wherein the at least one sense amplifier comprises a differential sense amplifier in the second arrangement.

6. The apparatus of claim 1, wherein the at least one configuration device connects at least one memory cell of the plurality of memory cells to a first input of the at least one sense amplifier and connects at least one other memory cell of the plurality of memory cells to a second input of the at least one sense amplifier in the second arrangement.

7. The apparatus of claim 1, wherein individual ones of the first and second portions of the memory array comprise at least one bank of the memory array.

8. The apparatus of claim 1, wherein the memory array comprises a plurality of portions, the first and second portions included in the plurality of portions, and
wherein the at least one configuration device comprises a plurality of configuration devices, wherein a number of the plurality of configuration devices is equal to a number of the plurality of portions of the memory array.

9. The apparatus of claim 1, wherein at least two of the plurality of memory cells are coupled to a plate.

10. The apparatus of claim 9, wherein the plate is coupled to a plate potential.

11. A system comprising:
a memory controller; and
a memory device comprising a reference line and a memory array including at least one configuration device, a plurality of memory cells and at least one sense amplifier,
wherein the memory controller is configured to provide at least one command to the memory device,
wherein, based, at least in part, on the at least one command, the memory device is configured to program the at least one configuration device to arrange at least one portion of the memory array in a first arrangement and arrange at least one other portion of the memory array in a second arrangement different from the first arrangement,
wherein the at least one configuration device connects one memory cell of the plurality of memory cells to a first input of the at least one sense amplifier and further connects the reference potential line to a second input of the at least one sense amplifier in the first arrangement.

12. The system of claim 11, wherein the memory device is further configured to write at least one value to a non-volatile register based, at least in part, on the at least one command.

13. The system of claim 12, wherein the at least one value indicates the at least one portion of the memory array having the first arrangement and indicates the at least one other portion of the memory array having the second arrangement.

14. The system of claim 11, wherein the memory device is further configured to set a fuse, an antifuse, a switch, or a combination thereof, based at least in part on the at least one arrangement command.

15. The system of claim 11, wherein the first arrangement comprises a portion of the memory array having higher storage density than the second arrangement.

16. The system of claim 11, wherein the second arrangement comprises a portion of the memory having faster access speed than the first arrangement.

17. The system of claim 11, wherein the at least one portion and the at least one other portion of the memory array each comprise a plurality of memory cells,
wherein individual ones of the plurality of memory cells of the at least one portion having the first arrangement comprise corresponding individual storage elements, and
wherein at least two of the plurality of memory cells of the at least one other portion having the second arrangement are combined to form a single storage element.

18. The system of claim 11, wherein at least two of the plurality of memory cells are coupled to a plate.

19. A method comprising:
receiving, at a memory device, a command;
responsive, at least in part, to the command, programming at least one configuration device of the memory device; and
responsive to the programming, arranging, with the at least one configuration device, a first portion of a memory array of the memory device in a first arrangement and a second portion of the memory array in a second arrangement different from the first arrangement,
wherein arranging the first portion of the memory array in the first arrangement comprises selectively connecting individual ones of a plurality of memory cells to a plurality of sense amplifiers such that one of the plurality of memory cells is coupled to a corresponding one of the plurality of sense amplifiers at a time and further coupling the plurality of sense amplifiers to a reference potential line.

20. The method of claim 19, further comprising:
receiving a second command at the memory device;
responsive, at least in part, to the second command, reprogramming the at least one configuration device; and
responsive to the reprogramming, rearranging the first portion, the second portion, or a combination thereof in a different arrangement.

21. The method of claim 19, wherein programming the at least one configuration device comprises setting at least one switch of the at least one configuration device.

22. The method of claim 19, wherein programming the at least one configuration device comprises setting at least one fuse, at least one antifuse, or a combination thereof of the at least one configuration device.

23. The method of claim 19, further comprising, responsive to the command, writing at least one value to a nonvolatile register, wherein the at least one value indicates the first portion of the memory array having the first arrangement and second portion of the memory array having the second arrangement.

24. The method of claim 19, further comprising;
receiving an access command and an address:
responsive, at least in part, to the address, switching a memory cell of the plurality of memory cells connected to a sense amplifier of the plurality of sense amplifiers.

25. The method of claim 19, wherein arranging the second portion of the memory array in the second arrangement comprises connecting at least two memory cells to a sense amplifier.

26. An apparatus comprising:
a memory array comprising a first portion arranged in a first arrangement and a second portion of the memory array in a second arrangement, wherein
the first arrangement comprises individual ones of a first plurality of memory cells coupled to corresponding ones of a first plurality of sense amplifiers, wherein the first plurality of sense amplifiers are configured as unipolar sense amplifiers; and
the second arrangement comprises at least two of a second plurality of memory cells coupled to a sense amplifier a plurality of sense amplifiers, wherein the sense amplifier is configured to act as a differential sense amplifier, wherein the memory array comprises:
a first side wall;
a second side wall:
a third side wall, wherein the first, second, and third side walls are parallel and spaced apart from one another:
a first plurality of capacitors arranged along the first sidewall;
a second plurality of capacitors arranged along the second sidewall;
a third plurality of capacitors arranged along the third side wall.

27. The apparatus of claim 26, wherein the first portion comprises a memory mat, a bank, or a bank group of the memory array.

28. The apparatus of claim 26, wherein the first arrangement comprises a higher storage density than the second arrangement.

29. The apparatus of claim 26, wherein the second arrangement comprises a faster access speed than the first arrangement.

30. The apparatus of claim 26, wherein individual ones of the first plurality of memory cells comprise corresponding ones of the first plurality of capacitors and wherein individual ones of the second plurality of memory cells comprise corresponding ones of the second plurality of capacitors and the third plurality of capacitors.

31. The apparatus of claim 30, wherein each of the first plurality of capacitors are configured to separately store at least one bit, and wherein a first one of the second plurality of capacitors and a second one of the third plurality of capacitors are configured to store at least one bit.

32. The apparatus of claim 26, further comprising a plate extending between the second sidewall and the third sidewall.

33. The apparatus of claim 26, wherein the first arrangement comprises a one-transistor-one capacitor (1T1C) architecture and the second arrangement comprises a two-transistor-two capacitor (2T2C) architecture.

* * * * *

UNITED STATES PATENT AND TRADEMARK OFFICE
CERTIFICATE OF CORRECTION

PATENT NO. : 12,112,785 B2
APPLICATION NO. : 17/732885
DATED : October 8, 2024
INVENTOR(S) : Angelo Visconti and Giorgio Servalli Page 1 of 1

It is certified that error appears in the above-identified patent and that said Letters Patent is hereby corrected as shown below:

In the Claims

| Column | Line | Claim | Reads | Should Read |
|---|---|---|---|---|
| 18 | 39 | 31 | wherein cach of the first | wherein each of the first |

Signed and Sealed this
Tenth Day of December, 2024

Katherine Kelly Vidal
*Director of the United States Patent and Trademark Office*